United States Patent
Mui et al.

(10) Patent No.: US 9,343,156 B1
(45) Date of Patent: May 17, 2016

(54) BALANCING PROGRAMMING SPEEDS OF MEMORY CELLS IN A 3D STACKED MEMORY

(71) Applicant: SanDisk Technologies Inc., Plano, TX (US)

(72) Inventors: Man L Mui, Santa Clara, CA (US); Yongke Sun, Pleasanton, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/750,250

(22) Filed: Jun. 25, 2015

(51) Int. Cl.
    G11C 11/34 (2006.01)
    G11C 16/10 (2006.01)
    G11C 16/34 (2006.01)

(52) U.S. Cl.
    CPC ............ *G11C 16/10* (2013.01); *G11C 16/3459* (2013.01)

(58) Field of Classification Search
    USPC ............ 365/185.05, 185.11, 185.17, 185.18, 365/185.2, 185.21, 185.22, 185.29, 185.33
    See application file for complete search history.

(56) References Cited

U.S. PATENT DOCUMENTS

| | | | |
|---|---|---|---|
| 8,310,870 B2 | 11/2012 | Dutta et al. | |
| 8,488,381 B2 | 7/2013 | Kim et al. | |
| 8,891,308 B1 * | 11/2014 | Ou | G11C 16/16 365/185.17 |
| 8,929,142 B2 * | 1/2015 | Dong | G11C 16/3427 365/185.17 |
| 8,954,214 B2 | 2/2015 | Pehrson et al. | |
| 8,964,473 B2 * | 2/2015 | Dong | H01L 27/11519 365/185.05 |
| 8,982,626 B2 | 3/2015 | Dong et al. | |
| 8,982,637 B1 * | 3/2015 | Dong | G11C 16/26 365/185.18 |
| 9,001,573 B1 | 4/2015 | Fantini et al. | |
| 9,165,659 B1 * | 10/2015 | Pang | G11C 16/10 |
| 9,230,663 B1 * | 1/2016 | Lu | G11C 11/5628 |
| 9,257,191 B1 * | 2/2016 | Yuan | G11C 11/5635 |
| 9,286,987 B1 * | 3/2016 | Dong | G11C 16/10 |
| 9,299,443 B1 * | 3/2016 | Dong | G11C 16/10 |
| 2005/0083735 A1 | 4/2005 | Chen et al. | |
| 2014/0226406 A1 | 8/2014 | Dong et al. | |

* cited by examiner

*Primary Examiner* — Trong Phan
(74) *Attorney, Agent, or Firm* — Vierra Magen Marcus LLP

(57) ABSTRACT

Programming techniques for a three-dimensional stacked memory device provide compensation for different intrinsic programming speeds of different groups of memory cells based on the groups' locations relative to the edge of a word line layer. A larger distance from the edge is associated with a faster programming speed. In one approach, the programming speeds are equalized by elevating a bit line voltage for the faster programming memory cells. Offset verify voltages which trigger a slow programming mode by elevating the bit line voltage can also be set based on the group locations. A programming speed can be measured during programming for a row or other group of cells to set the bit line voltage and/or the offset verify voltages. The compensation for the faster programming memory cells can also be based on their speed relative to the slower programming memory cells.

12 Claims, 13 Drawing Sheets

Fig. 2

Code in storage device (150)

boot code (151)

control code / set of instructions (160)

instructions to perform a programming operation for a set of memory cells (161)

instructions to apply a program voltage to a selected word line layer while applying a voltage to respective bit lines based on a position of associated memory cells within the selected word line layer (162)

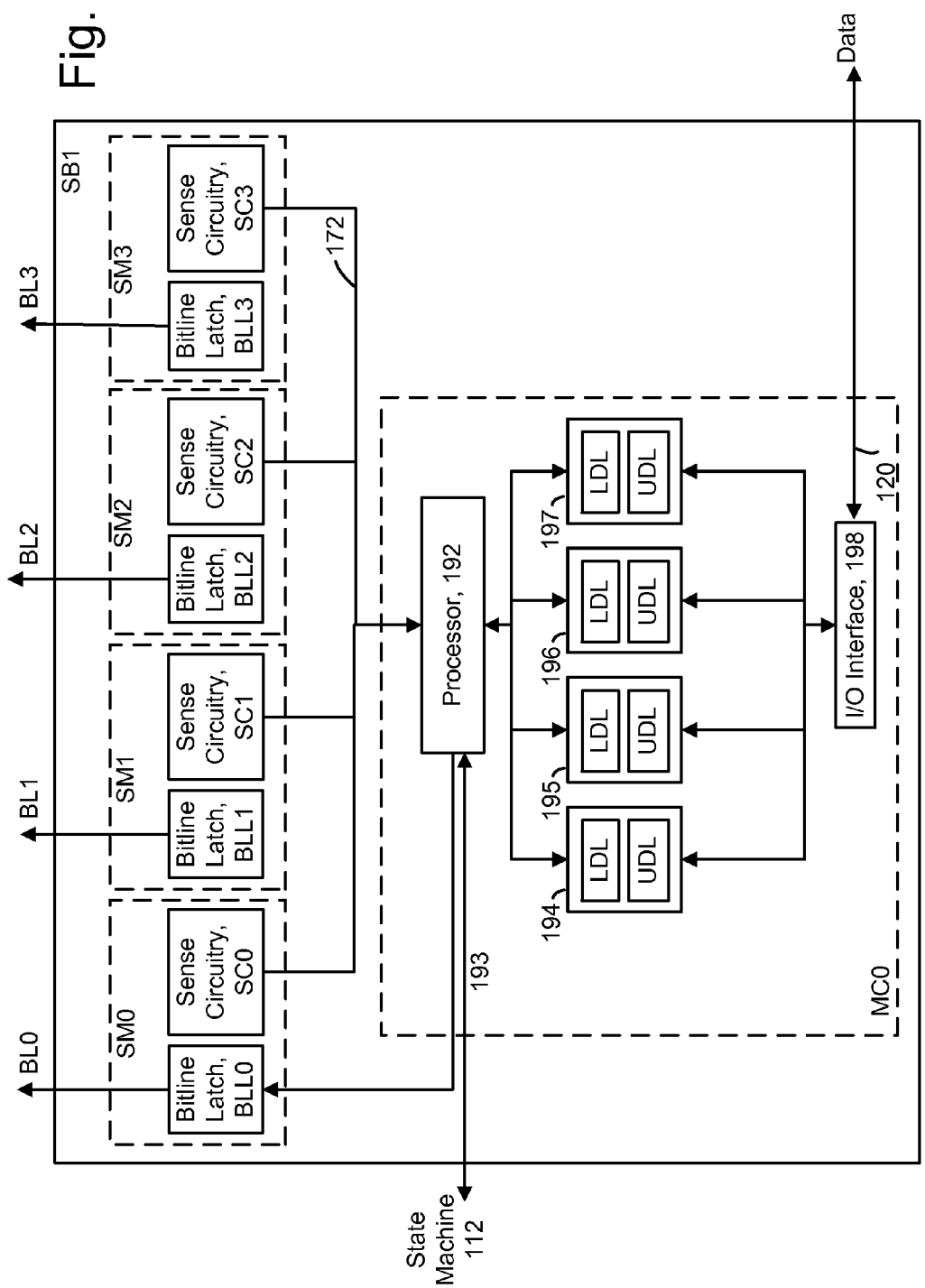

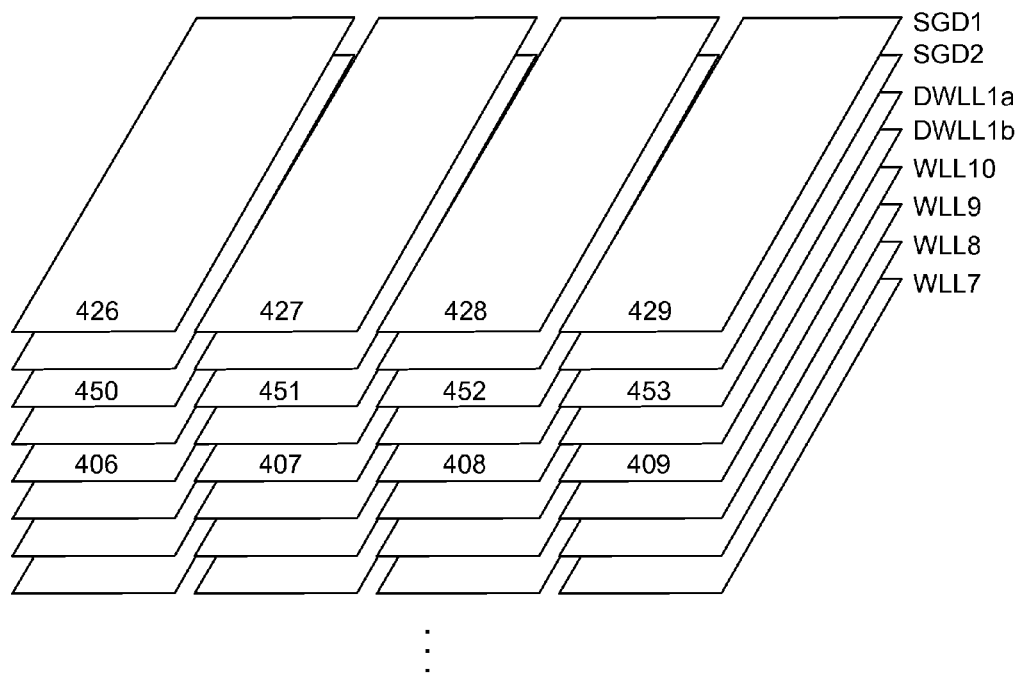
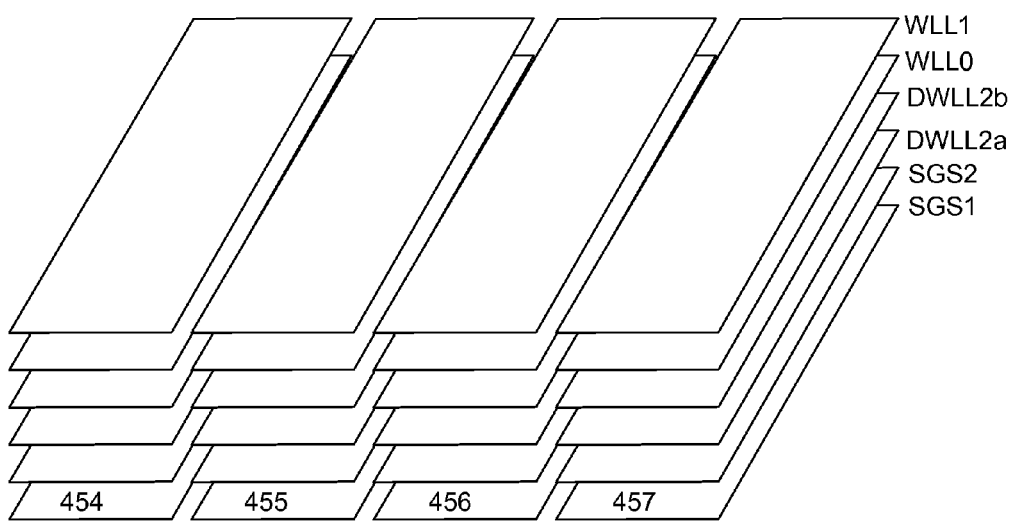
Fig. 4D

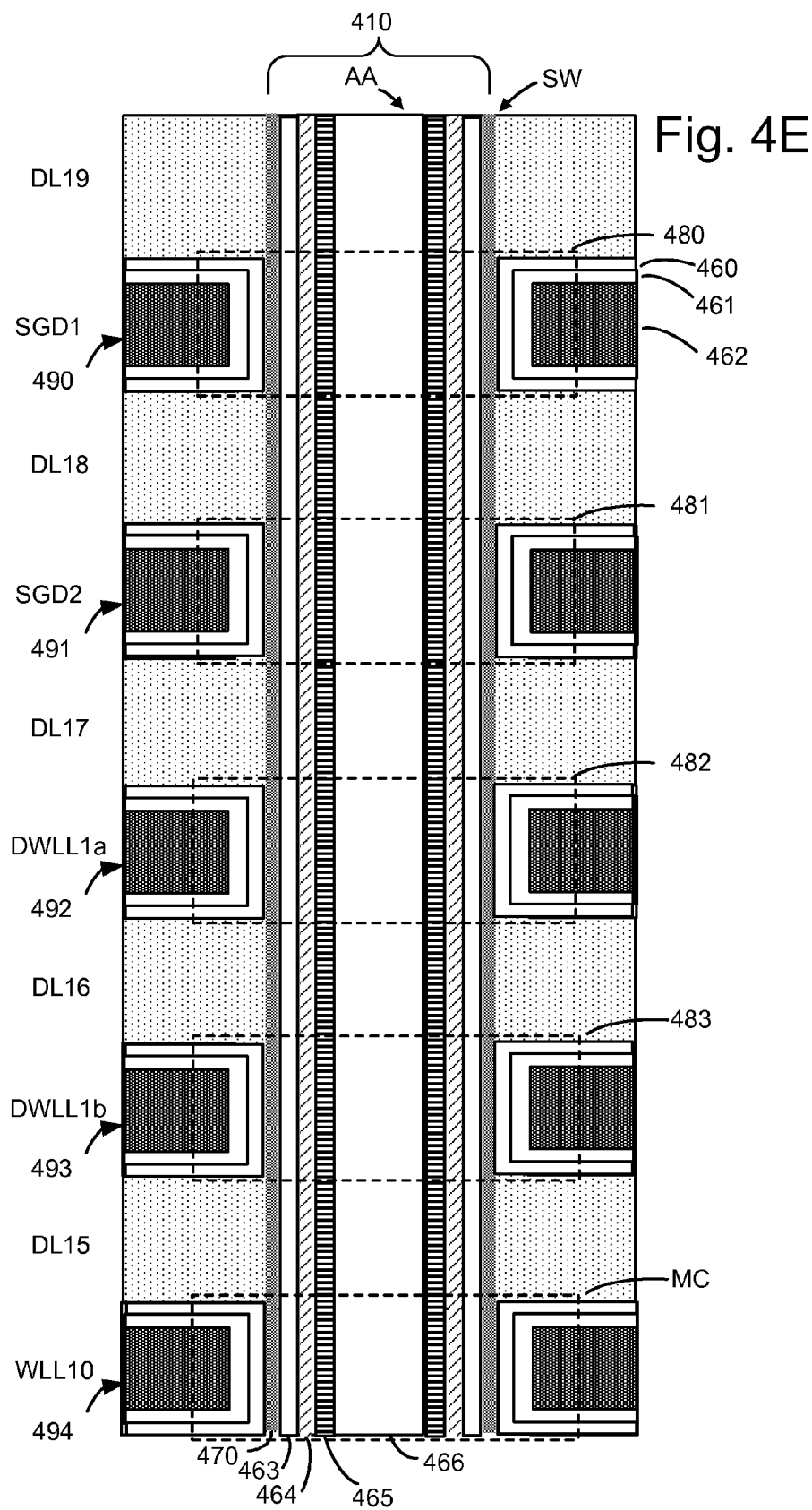

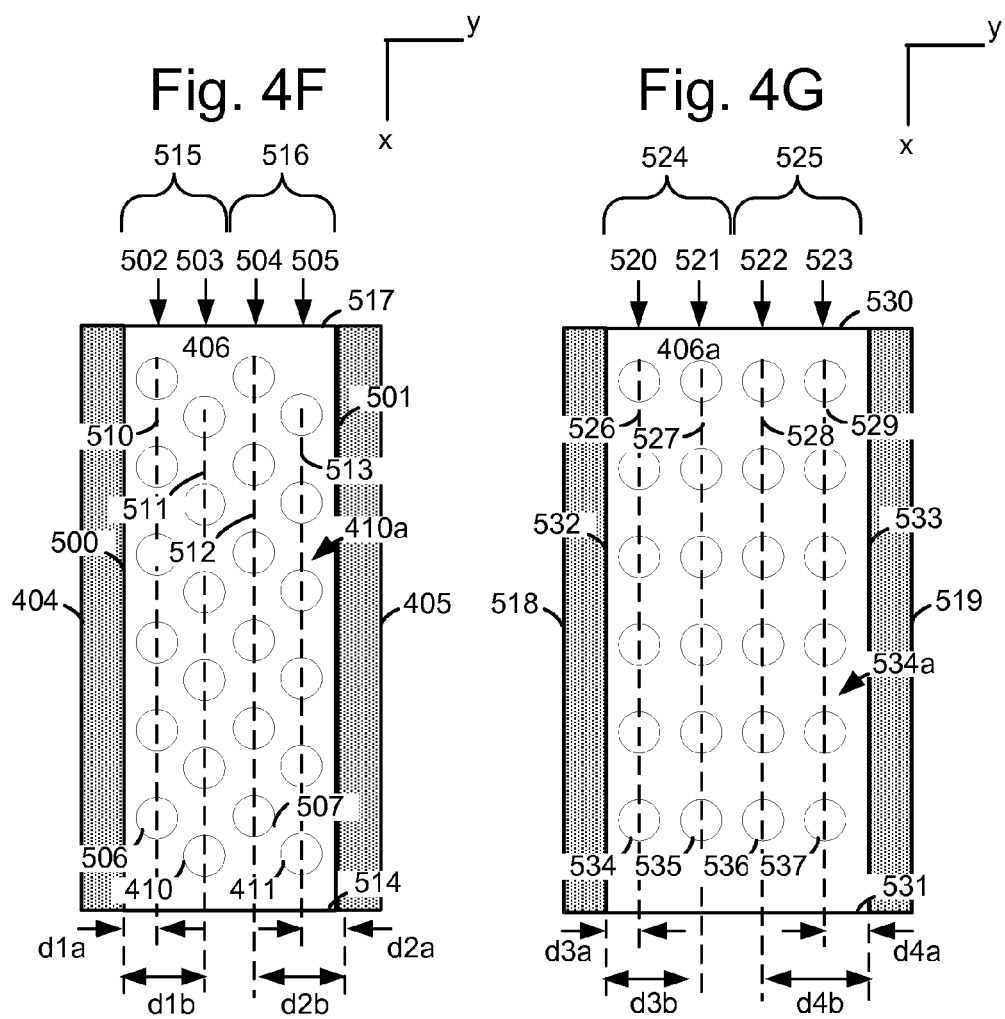

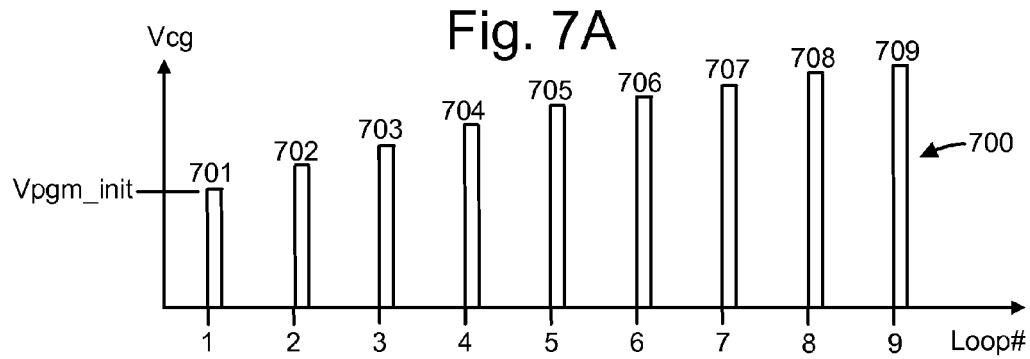
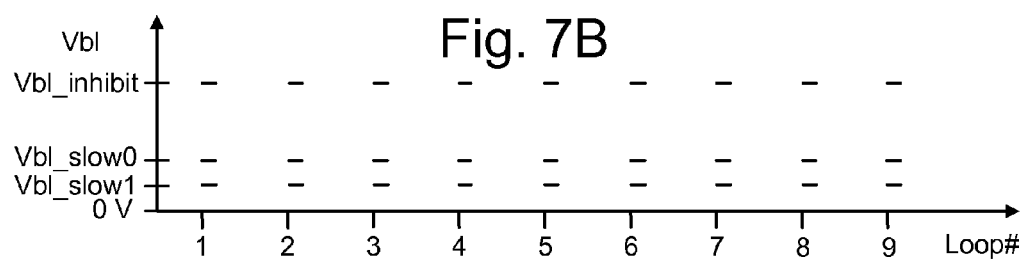
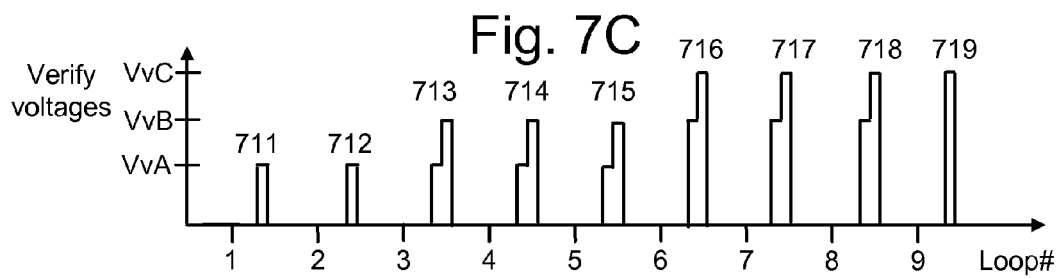
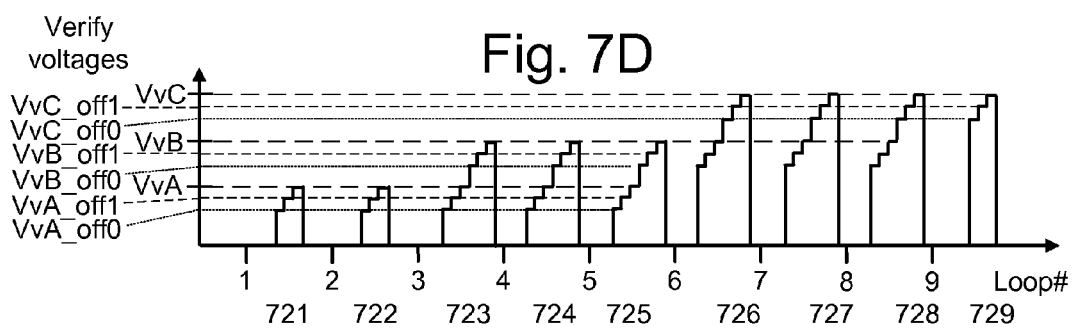
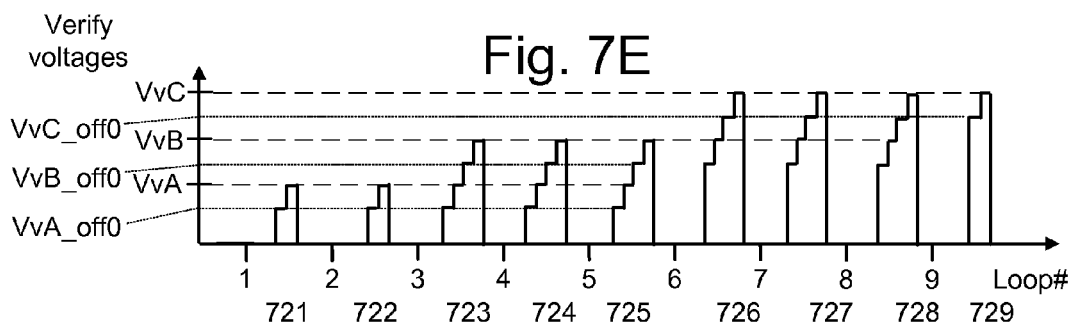

BALANCING PROGRAMMING SPEEDS OF MEMORY CELLS IN A 3D STACKED MEMORY

BACKGROUND

The present technology relates to the operation of a memory device.

Recently, ultra high density storage devices have been proposed using a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and of select gate transistors are provided by the conductive layers.

However, various challenges are presented in operating such memory devices.

SUMMARY

Programming techniques for a three-dimensional stacked memory device provide compensation for different intrinsic programming speeds of different groups of memory cells based on the groups' locations relative to the edge of a word line layer.

BRIEF DESCRIPTION OF THE DRAWINGS

Like-numbered elements refer to common components in the different figures.

FIG. 2 depicts code which may be executed by a processor.

FIG. 3 is a block diagram depicting one embodiment of the sense block SB1 of FIG. 1B.

FIG. 4D depicts an alternative view of the select gate layers and word line layers of the stack 440 of FIG. 4C.

FIG. 4E depicts a view of the region 442 of FIG. 4C.

FIG. 4F depicts the region 406 of FIG. 4A, where memory cells are arranged in four staggered rows.

FIG. 4G depicts a region 406a of an example word line layer, where memory cells are arranged in four uniform rows.

FIG. 7A depicts a set of program voltages, consistent with step 593 of FIG. 5.

FIG. 7B depicts a set of bit line voltages, consistent with steps 593 and 593a of FIG. 5 and with FIG. 6B.

FIG. 7C depicts a set of verify voltages, consistent with step 594 of FIG. 5.

FIG. 7D depicts a set of verify voltages, consistent with steps 594 and 594b of FIG. 5 and with FIG. 6A, where two offset verify voltages and a final verify voltage are used for each target data state.

FIG. 7E depicts a set of verify voltages, consistent with steps 594 and 594b of FIG. 5 and with FIG. 6A, where one offset verify voltage and a final verify voltage are used for each target data state.

DETAILED DESCRIPTION

Figure 1A:
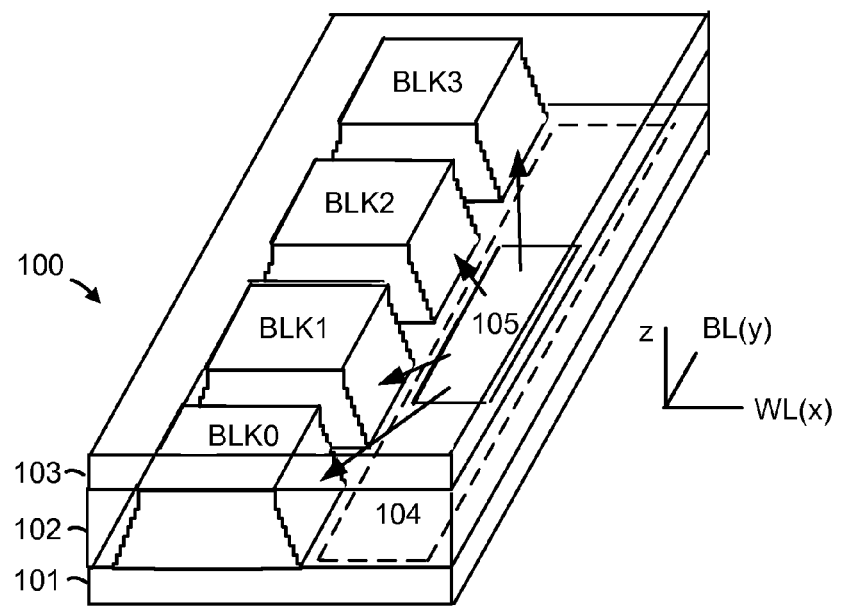
FIG. 1A is a perspective view of a set of blocks in a 3D stacked non-volatile memory device.

Techniques are provided for programming memory cells in a memory device such as a 3D stacked non-volatile memory device. A corresponding memory device is also provided.

A 3D stacked non-volatile memory device has a multi-layer configuration in which conductive layers alternate with dielectric layers in a stack. Memory holes are etched in the stack and films are deposited in the holes such that memory cells or select gate transistors are formed where the conductive layers intersect with the memory holes. The films can include a charge-trapping material, a tunneling layer and a channel material. Some of the conductive layers (e.g., control gate layers or word line layers) are used as control gates for memory cells and other conductive layers are used as control gates for select gate transistors, such as drain- or source-side transistors in NAND strings. The NAND strings extend vertically in the memory device. The charge-trapping material can be silicon nitride or other nitride, for instance. The memory cells can include data memory cells, which are eligible to store data, and dummy memory cells, which are not eligible to store data, but provide a transition region between a select gate and the data memory cells.

The memory cells are programmed to store data according to a threshold voltage (Vth) level. For example, two, four, eight, sixteen or more data states can be used. However, in order for the data to be read back accurately, the Vth distribution for each data state after programming should be as narrow as possible.

Techniques provided herein allow for narrow Vth distributions by providing compensation in the programming process based on variations in intrinsic programming speeds of the memory cells which are a function of the memory cells' locations in a word line layer. In one approach, the variation is due to a distance from an edge of a word line layer. In one implementation, a metal interconnect is adjacent to the edge of the word line layer. Groups of memory cells in a row which is parallel to the edge may have a similar intrinsic programming speed. The programming speed may be relatively higher for memory cells which are relatively further from the edge.

The adjustment to the programming process can occur in different ways. In one approach, the memory cells with the relatively higher intrinsic programming speed are slowed down so that all memory cells have a similar effective programming speed. One way to slow down the programming is to elevate a bit line voltage during a program voltage. In another approach, an offset verify voltage for the memory cells is adjusted based on the intrinsic programming speed. For example, the offset verify voltage can be relatively lower for memory cells with the relatively higher intrinsic programming speed. The offset verify voltage is below the final verify voltage of a target data state, and triggers a slow programming mode for a memory cell, e.g., by elevating a bit line voltage. The various approaches can be combined as well.

The intrinsic programming speed for the memory cells can be determined in different ways, e.g., from testing at the time of manufacture or measured during programming. For example, the programming speed for a group of memory cells can be determined based on a number of memory cells which have a Vth above a specified voltage after a specified number of program pulses have been applied. The programming speed for a group of memory cells could also be determined based on a number of program pulses which are used to cause a specified number or portion of the memory cells to have a Vth above a specified voltage.

The following discussion provides details of example memory devices and programming techniques which address the above and other issues.

FIG. 1A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions (the word line WL(x) and bit line BL(y) directions, respectively).

Each control gate layer in a block can be divided into regions such as depicted in FIGS. 4A, 4B, 4D, 4F, 4G and 4H, in one possible approach.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
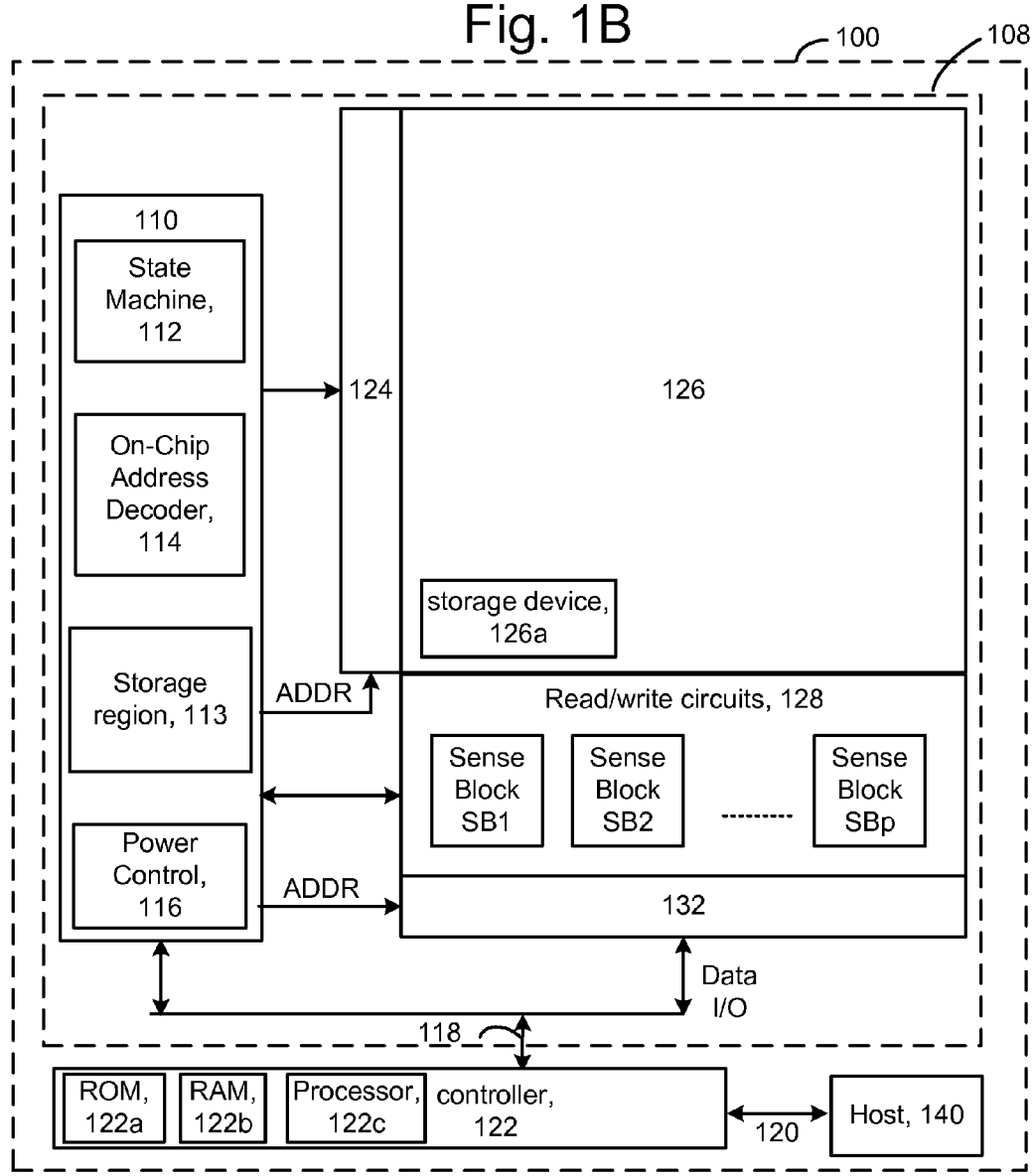
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The set of blocks of FIG. 1A can be on one die. The memory die 108 includes a memory structure 126 of memory cells, such as an array of memory cells, control circuitry 110, and read/write circuits 128. In a 3D configuration, the memory structure can include the blocks of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118 as Data I/O (input/output).

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface (ADDR) between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 2 depicts code which may be executed by the processor 122c. The code 150 is used by the controller to access the memory structure such as for programming, read and erase operations. The code can include boot code 151 and control code (e.g., a set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions includes instructions to perform a programming operation for a set of memory cells (161). These instructions can include instructions to apply a program voltage to a selected word line layer while applying a voltage to respective bit lines based on a location of associated memory cells within the selected word line layer (162). Generally, the control code can include instructions to perform the functions described herein including the steps of the process of FIG. 5.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 3 is a block diagram depicting one embodiment of the sense block SB1 of FIG. 1B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a program voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 6A) corresponding to the various memory states supported by the memory (e.g., states A, B and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of program voltage pulses applied to the control gates of the addressed memory cells. Each program voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if program voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4A:
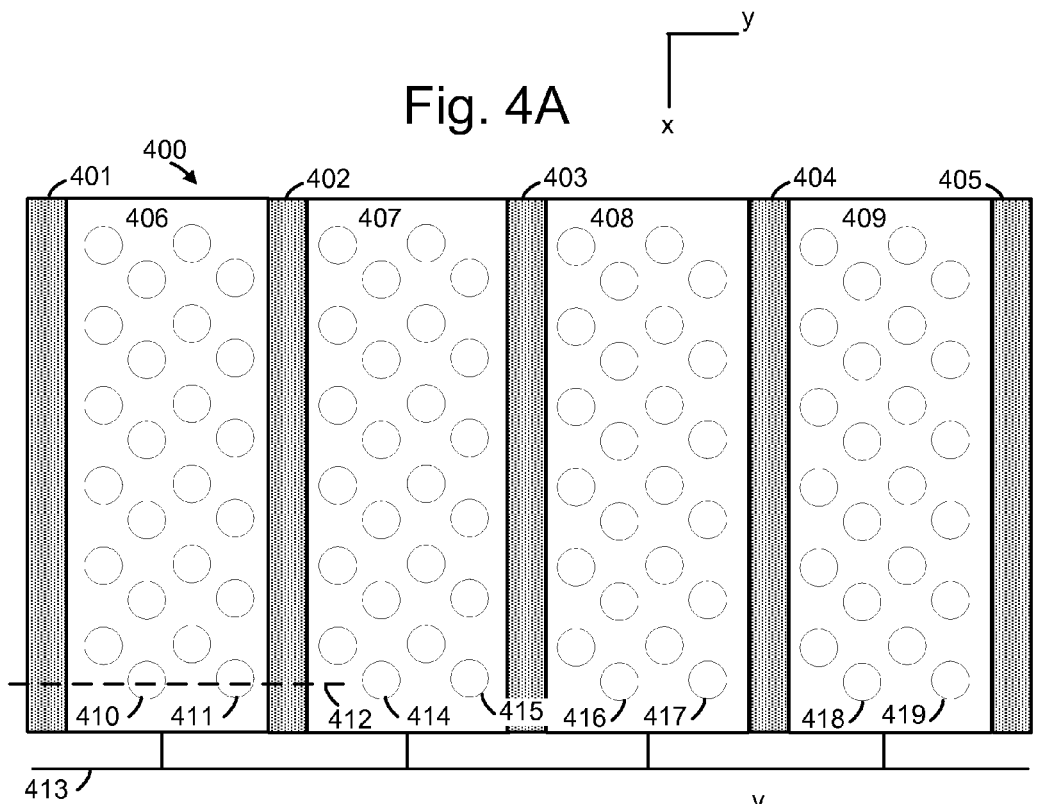
FIG. 4A depicts a top view of an example word line layer 400 of the block BLK0 of FIG. 1A, in a straight NAND string embodiment.

FIG. 4A depicts a top view of an example word line layer 400 of the block BLK0 of FIG. 1A, in a straight NAND string embodiment. As mentioned, a word line layer in each block in FIG. 1A can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filled with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412. See also FIG. 4C. The region 407 has example memory holes 414 and 415. The region 408 has example memory holes 416 and 417. The region 409 has example memory holes 418 and 419.

Each circle represents the cross-section of a memory hole at a word line layer or select gate layer. Each circle can alternatively represent a memory cell which is provided by the materials in the memory hole and by the adjacent word line layer.

Metal-filled slits 401, 402, 403, 404 and 405 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

Figure 4B:
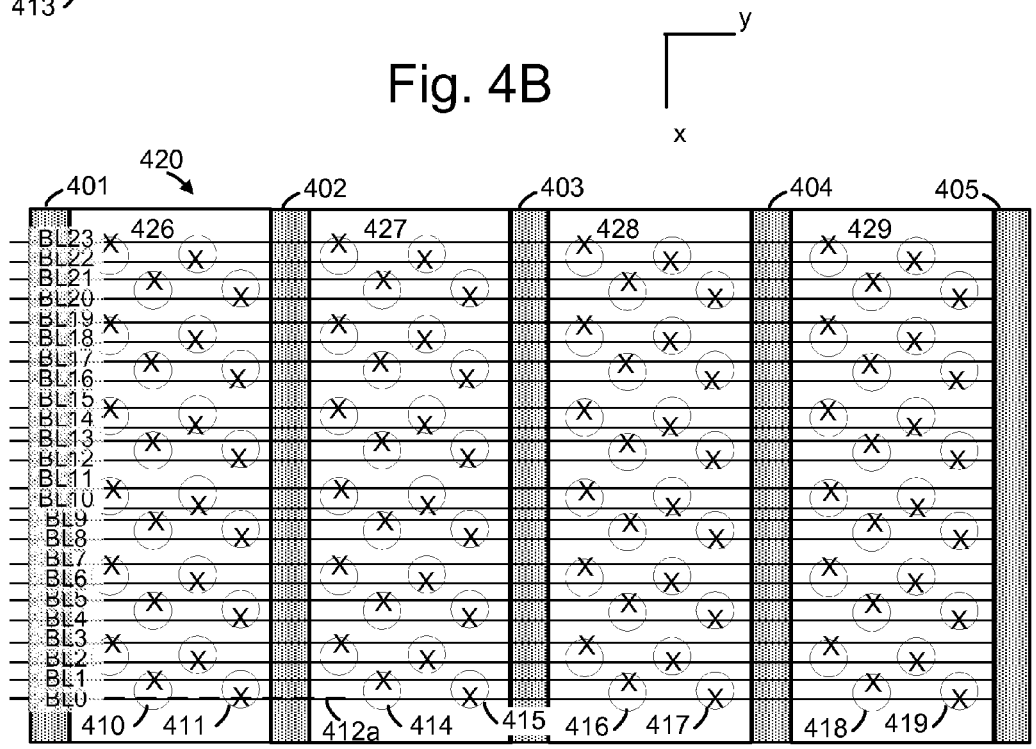
FIG. 4B depicts a top view of an example SGD layer 420, consistent with FIG. 4A.

FIG. 4B depicts a top view of an example SGD layer 420, consistent with FIG. 4A. The SGD layer is divided into regions 426, 427, 428 and 429. Each region can be connected to a respective voltage driver and is associated with a different sub-block. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412a which is coincident with a bit line BL0. See also FIG. 4C. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403, 404 and 405 from FIG. 4A are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. See, e.g., row 505 of region 406 in FIG. 4F. BL2, BL6, BL10, BL14, BL18 and BL22 are connected to cells in an adjacent row of cells, adjacent to the first row at the right hand edge. See, e.g., row 504 of region 406 in FIG. 4F. BL3, BL7, BL11, BL15, BL19 and BL23 are connected to cells in a first row of cells at the left hand edge of each region. See, e.g., row 502 of region 406 in FIG. 4F. BL1, BL5, BL9, BL13, BL17 and BL21 are connected to cells in an adjacent row of cells, adjacent to the first row at the left hand edge. See, e.g., row 503 of region 406 in FIG. 4F.

Figure 4C:
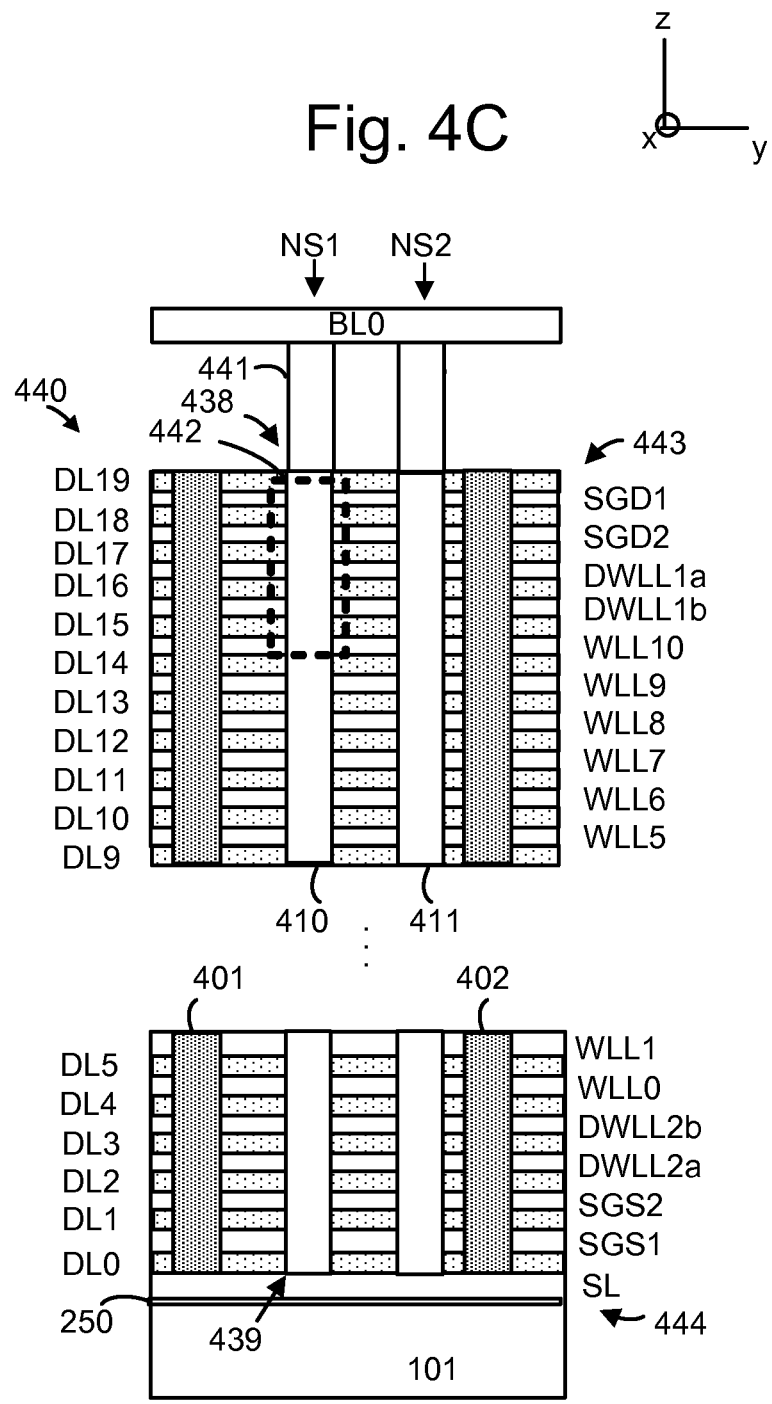
FIG. 4C depicts an embodiment of a stack 440 showing a cross-sectional view along line 412 of FIG. 4A and line 412a of FIG. 4B.

FIG. 4C depicts an embodiment of a stack 440 showing a cross-sectional view along line 412 of FIG. 4A and line 412a of FIG. 4B. Two SGD layers, two SGS layers and four dummy word line layers DWLL1a, DWLL1b, DWLL2a and DWLL2b are provided, in addition to the data word line layers WLL0-WLL10. Columns of memory cells corresponding to NAND strings NS1 and NS2 are depicted in the multi-layer stack. The stack includes a substrate 101, an insulating film 250 on the substrate, and a portion of a source line SL. NS1 has a source end 439 at a bottom 444 of the stack and a drain end 438 at a top 443 of the stack. The metal-filled slits 401 and 402 from FIGS. 4A and 4B are also depicted. A portion of the bit line BL0 is also depicted. A conductive via 441 connects the drain end 438 to BL0. A region 442 of the stack is shown in greater detail in FIGS. 4E and 4F.

FIG. 4D depicts an alternative view of the select gate layers and word line layers of the stack 440 of FIG. 4C. The SGD layers SGD1 and SGD2 each includes parallel rows of select gate lines associated with the drain-side of a set of NAND strings. For example, SGD1 includes drain-side select gate regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLL1a comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and program operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS1 and SGS2 each includes parallel rows of select gate lines associated with the source-side of a set of NAND strings. For example, SGS1 includes source-side select gate lines 454, 455, 456 and 457. Each select gate line can be independently controlled, in one approach. Or, the select gate lines can be connected and commonly controlled.

FIG. 4E depicts a view of the region 442 of FIG. 4C. SGD transistors 480 and 481 are provided above dummy memory cells 482 and 483 and a data memory cell MC. A number of layers can be deposited along the sidewall (SW) of the memory hole 410 and/or within each word line layer, e.g., using atomic layer deposition. For example, each column (e.g., the pillar which is formed by the materials within a memory hole) can include a charge-trapping layer or film 463 such as SiN or other nitride, a tunneling layer 464, a polysilicon body or channel 465, and a dielectric core 466. A word line layer can include a blocking oxide 470, a block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

FIG. 4F depicts the region 406 of FIG. 4A, where memory cells are arranged in four staggered rows. The metal-filled slits 404 and 405 are depicted. The memory cells are arranged in rows 502, 503, 504 and 505 which extend parallel to edges 500 and 501 of the region. The edges 500 and 501 are parallel to one another and on opposing sides of the region, facing away from one another, in this example. The region also includes edges 514 and 517 which are parallel to one another and on opposing sides of the region, facing away from one another, in this example. The edges 514 and 517 are perpendicular to, and connect, the edges 500 and 501, in one approach. The edges 514 and 517 may coincide for different word line layers, or the edges may step down in a terrace from the top of the stack, for instance. Other configurations are possible as well. In one approach, as depicted here, the edges 514 and 517 are not adjacent to metal interconnects. A set 410a of selected memory cells in a programming operation may include each of the memory cells in the region 406.

The rows 502, 503, 504 and 505 include memory cells which extend along dashed lines 510, 511, 512 and 513, respectively, including example memory cells 506, 410, 507 and 411, respectively. The rows 502 and 503 are in one half 515 of the region 406 which is closer to the edge 500 than the edge 501, and the rows 504 and 505 are in another half 516 of the region 406 which is closer to the edge 501 than the edge 500. Further, the rows 502 and 503 are at a distance d1a and d1b, respectively, from the edge 500, and the rows 504 and 505 are at a distance d2b and d2a, respectively, from the edge 501. In one approach, the rows of memory holes are arranged symmetrically on each side of the region so that d1a=d2a and d1b=d2b, but other configurations are possible. In any case, d1b>d1a and d2b>d2a.

In one approach, a set of memory cells comprises a first row (e.g., 502) of memory cells which is adjacent to a first edge (e.g., 500) and a second row (e.g., 503) of memory cells which is adjacent to the first row. Further, to perform a programming operation for a set of memory cells, a control circuit is configured to: concurrently apply a program voltage to the selected word line layer and apply voltages to the plurality of bit lines, wherein the voltages applied to the plurality of bit lines comprise a first voltage (e.g., Vbl=0 V) which is applied to respective bit lines associated with the first row of memory cells and a second voltage (e.g., Vbl_slow0 or Vbl_slow1, see FIG. 6B) which is applied to respective bit lines associated with the second row of memory cells, and the second voltage is greater than the first voltage and is a positive voltage. The set of memory cells can further include one row (e.g., 505) of memory cells which is adjacent to a second edge (e.g., 501) and another row (e.g., 504) of memory cells which is adjacent to the one row. The voltages applied to the plurality of bit lines comprise one voltage (e.g., 0 V) which is applied to respective bit lines associated with the one row of memory cells and another voltage (e.g., Vbl_slow0 or Vbl_slow1) which is applied to respective bit lines associated with the another row of memory cells.

The another voltage can be greater than the one voltage and can be a positive voltage. The one voltage can be equal to the first voltage and the another voltage can be equal to the second voltage.

Rows 502 and 505 are edge rows and rows 503 and 504 are interior rows. The edge 500 may be a first edge, where a set of memory cells comprises a row 502 of memory cells at a first distance d1a from the first edge, and a row 503 of memory cells at a second distance d1b from the first edge, wherein the second distance is greater than the first distance.

FIG. 4G depicts a region 406a of an example word line layer, where memory cells are arranged in four uniform rows. Metal-filled slits 518 and 519 are depicted. The memory cells are arranged in rows 520, 521, 522 and 523 which extend parallel to edges 532 and 533 of the region. The edges 532 and 533 are parallel to one another and on opposing sides of the region, facing away from one another, in this example. The region also includes edges 530 and 531 which are parallel to one another and on opposing sides of the region, facing away from one another, in this example. The edges 530 and 531 are perpendicular to, and connect, the edges 532 and 533, in one approach. The edges 530 and 531 may coincide for different word line layers, or the edges may step down in a terrace from the top of the stack, for instance, in a terrace structure. In one approach, as depicted here, the edges 530 and 531 are not adjacent to metal interconnects. A set 534a of selected memory cells in a programming operation may include each of the memory cells in the region 406a.

The rows 520, 521, 522 and 523 include memory cells which extend along dashed lines 526, 527, 528 and 529, respectively, including example memory cells 534, 535, 536 and 537, respectively. The rows 520 and 521 are in one half 524 of the region 406a which is closer to the edge 532 than the edge 533, and the rows 522 and 523 are in another half 525 of the region 406a which is closer to the edge 533 than the edge 532. Further, the rows 520 and 521 are at a distance d3a and d3b, respectively, from the edge 532, and the rows 522 and 523 are at a distance d4b and d4a, respectively, from the edge 533. In one approach, the rows of memory holes are arranged symmetrically on each side of the region so that d3a=d4a and d3b=d4b, but other configurations are possible. In any case, d3b>d3a and d4b>d4a.

Figure 4H:
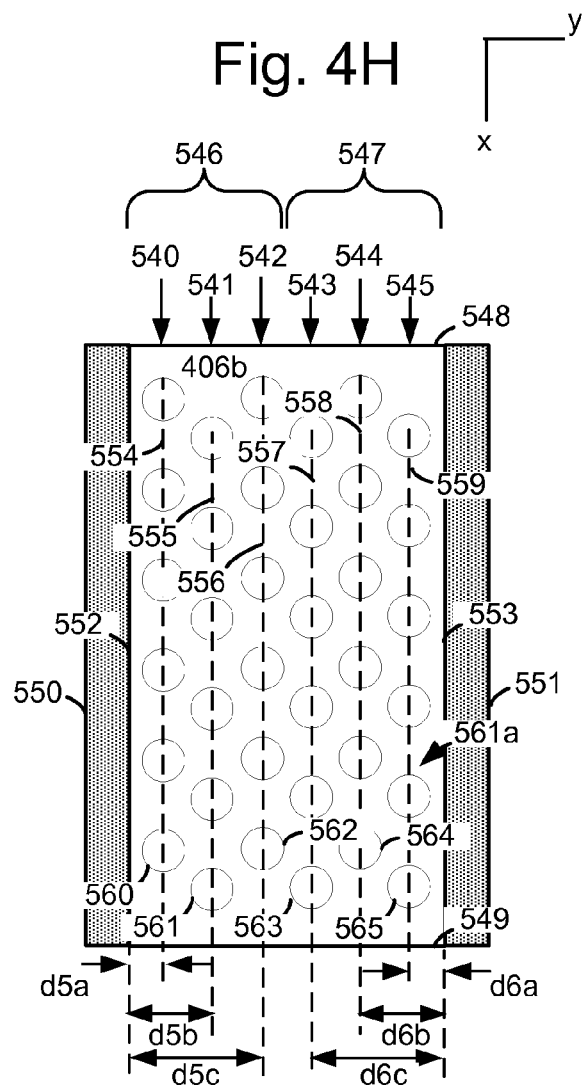
FIG. 4H depicts a region 406b of an example word line layer, where memory cells are arranged in six staggered rows.

FIG. 4H depicts a region 406b of an example word line layer, where memory cells are arranged in six staggered rows. Metal-filled slits 550 and 551 are depicted. The memory cells are arranged in rows 540, 541, 542, 543, 544 and 545 which extend parallel to edges 552 and 553 of the region. The edges 552 and 553 are parallel to one another and on opposing sides of the region, facing away from one another, in this example. The region also includes edges 548 and 549 which are parallel to one another and on opposing sides of the region, facing away from one another, in this example. The edges 548 and 548 are perpendicular to, and connect, the edges 552 and 553, in one approach. The edges 548 and 549 may coincide for different word line layers, or the edges may step down in a terrace from the top of the stack, for instance. In one approach, as depicted here, the edges 548 and 549 are not adjacent to metal interconnects. A set 561a of selected memory cells in a programming operation may include each of the memory cells in the region 406b.

The rows 540, 541, 542, 543, 544 and 545 include memory cells which extend along dashed lines 554, 555, 556, 557, 558 and 559, respectively, including example memory cells 560, 561, 562, 563, 564 and 565, respectively. The rows 540, 541 and 542 are in one half 546 of the region 406b which is closer to the edge 552 than the edge 553, and the rows 543, 544 and 545 are in another half 547 of the region 406b which is closer to the edge 553 than the edge 552. Further, the rows 540, 541 and 542 are at a distance d5a, d5b and d5c, respectively, from the edge 552, and the rows 543, 544 and 545 are at a distance d6c, d6b and d6a, respectively, from the edge 553. In one approach, the rows of memory holes are arranged symmetrically on each side of the region so that d5a=d6a, d5b=d6b and d5c=d6c, but other configurations are possible. In any case, d5c>d5b>d5a and d6c>d6b>d6a.

Rows 540 and 545 are edge rows, rows 541 and 544 are first interior rows, and rows 542 and 543 are second interior rows. The edge 552 may be a first edge, where a set of memory cells comprises a row 540 of memory cells at a first distance d5a from the first edge, a row 541 of memory cells at a second distance d5b from the first edge, wherein the second distance is greater than the first distance, and a row 542 of memory cells at a third distance d5c from the first edge, where the third distance is greater than the second distance.

Figure 4I:
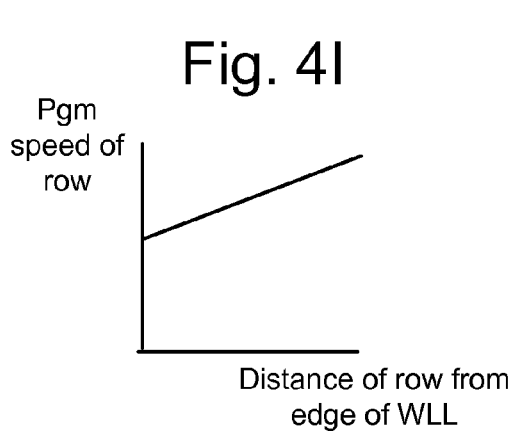
FIG. 4I depicts a plot of an intrinsic programming speed of a row of memory cells versus a distance of the row from an edge of a word line layer (WLL).

FIG. 4I depicts a plot of an intrinsic programming speed of a row of memory cells versus a distance of the row from an edge of a word line layer (WLL). The programming speed of a memory cell can be defined as the increase in the Vth of the memory cell when a program voltage is applied. The programming speed is a function of a program slope, which is a rate of increase in Vth when successive program voltages with a given step size are applied. It has been observed that the programming speed of a memory cell can vary based on the location of the memory cell in a WLL. In some cases, the programming speed is relatively higher when the memory cell is relatively further from the edge of the word line layer. Similarly, the programming speed of a group of memory cells such as a row of memory cells can vary based on the location of the group in a word line layer.

The plot indicates that the programming speed of a row of memory cells is relatively higher when the distance of the row from the edge of the WLL is relatively greater. For example, in FIG. 4F, rows 503 and 504 will have a relatively higher programming speed than rows 502 and 505, respectively. Moreover, the programming speeds of rows 502, 503, 504 and 505 may be proportional to d1a, d1b, d2b and d2a, respectively. The programming speed of a row may be an average or median of the programming speeds of the memory cells in the row, for instance. The variation in programming speed may be due to process variations or imperfections which could cause structural and hence electrical behavior differences for memory cells in different locations. Interactions between the word line layer and the metal interconnect may also affect programming speed.

The differences in both program speeds and slope lead to a wider natural Vth distribution. Moreover, this distribution can widen as program voltage increases. A higher final program voltage and more program loops may be needed to finish the programming operation. As a result, programming performance will be degraded, and program disturb will be more severe. The techniques provided herein overcome these problems by balancing program speed and slope across a set of memory cells. The techniques result in an overall faster programming, a narrower Vth distribution, reduced program disturb and better reliability.

In FIG. 4G, rows 521 and 522 will have a relatively higher programming speed than rows 520 and 523, respectively. The programming speeds of rows 520, 521, 522 and 523 may be proportional to d3a, d3b, d4b and d4a, respectively.

In FIG. 4H, rows 542 and 543 will have a relatively higher programming speed than rows 541 and 544, respectively. Rows 541 and 544 will have a relatively higher programming speed than rows 540 and 545, respectively. The programming speeds of rows 540, 541, 542, 543, 544 and 545 may be proportional to d5a, d5b, d5c, d6c, d6b and d6a, respectively.

Figure 5:
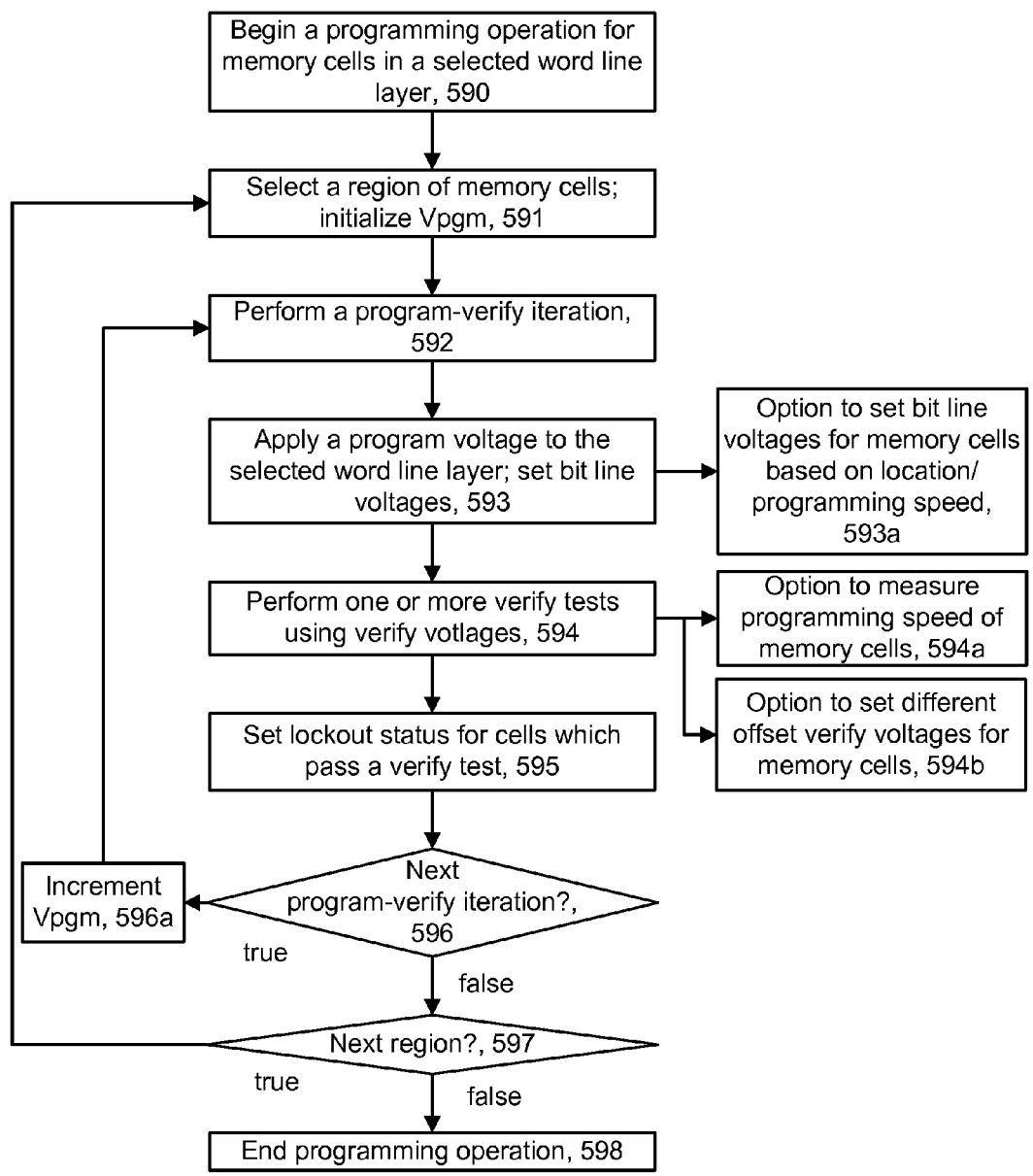
FIG. 5 depicts a programming operation which provides compensation for different intrinsic programming speeds of memory cells based on their location within a word line layer.

FIG. 5 depicts a programming operation which provides compensation for different intrinsic programming speeds of memory cells based on their location within a word line layer. The process is for programming a word line, and may be repeated for programming of additional word lines. At step 590, a programming operation begins for memory cells in a selected word line layer. At step 591, a region of memory cells in the word line layer is selected, and a program voltage Vpgm is initialized. For example, region 406 in FIG. 4A may be selected for programming, after which regions 407, 408 and 409 are selected in turn for programming in the selected word line layer. Subsequently, another word line layer may be selected for programming, and so forth.

At step 592, a program-verify iteration is performed. This can involve steps 593-595. Each program-verify iteration of a plurality of program-verify iterations comprises a program portion (e.g., a program voltage) followed by a verify portion (e.g., one or more verify voltages and associated sensing operations). At step 593, a program voltage is applied to the selected word line layer, while bit line voltages are set to inhibit or allow programming. See, e.g., FIGS. 7A and 7B. Each memory cell in the region can be connected to a respective bit line via a drain-end of a NAND string in which the memory cell is located. Step 593a provides an option to set different bit line voltages for memory cells based on the locations and/or intrinsic programming speeds of the memory cells in the region. See, e.g., FIGS. 6B and 7B. For example, the bit line voltage for a particular cell may be set based on a row in which the particular cell is located. Step 594 performs one or more verify tests using verify voltages. See, e.g., FIG. 7C. Step 594a provides an option to measure the programming speed of the memory cells. See, e.g., FIGS. 6C, 6D and 6F. Step 594b provides an option to set different offset verify voltages for the memory cells based on the measured programming speed and/or location in the region. See, e.g., FIGS. 6E and 7D.

Step 595 involves setting a lockout status for cells which pass a verify test. For example, this status can be set in the latches associated with the memory cells. A decision step 596 determines whether there is a next program-verify iteration for the region. This is false if all or nearly all of the memory cells in the region have been programmed. If decision step 596 is true, step 596a increments Vpgm and step 592 begins the next program-verify iteration. If decision step 596 is false, a decision step 597 determines whether there is a next region of memory cells to program in the selected word line layer. If decision step 597 is true, step 591 selects another region of memory cells to program and initializes Vpgm. If decision step 597 is false, the programming operation for the word line layer ends at step 598.

In one implementation, referring to FIG. 4F-4H, the selected word line layer comprises a first edge (e.g., the edge 500 or 501, 532 or 533, or 552 or 553), the set of memory cells comprises a first row of memory cells (e.g., the row 503 or 505, 520 or 523, or 541 or 544) at a first distance (e.g., d1a or d2a, d3a or d4a, or d5a or d6a) from the first edge, and a second row of memory cells at a second distance (e.g., d1b or d2b, d3b or d4b, or d5b or d6b) from the first edge, wherein the second distance is greater than the first distance. Further, performing the programming operation comprises performing a plurality of program-verify iterations for the selected word line layer, wherein each program-verify iteration of the plurality of program-verify iterations comprises a program portion followed by a verify portion, and wherein at least one program-verify iteration of the plurality of program-verify iterations provides compensation for different programming speeds of the first and second rows of memory cells. For example, the compensation can involve adjusting a bit line voltage used during the program portion, and/or a respective offset verify voltage of a target data state which is used during the verify portion to trigger a slow programming mode. The compensation can be based on a programming speed.

Further, the compensation can account for a different programming speed of a third row of memory cells (e.g., row 542 or 543 in FIG. 4H) at a third distance (e.g., d5c or d6c) from the first edge relative to the first and second rows.

Figure 6A:
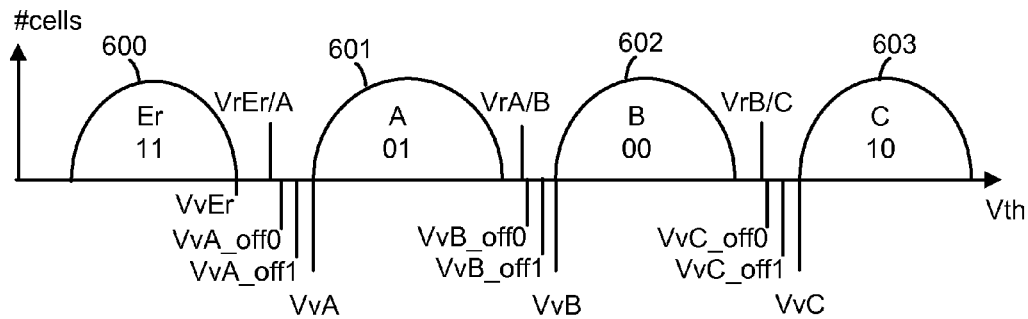
FIG. 6A depicts a threshold voltage (Vth) distribution and example read voltages for a set of memory cells, consistent with the process of FIG. 5.

FIG. 6A depicts a threshold voltage (Vth) distribution and example read voltages for a set of memory cells, consistent with the process of FIG. 5. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1D. For example, the LP bit can be stored in LDL and the UP bit can be stored in UDL. In another example, each memory cell stores three bits of data in one of eight possible Vth ranges.

A first Vth distribution 600 is provided for erased (Er) state memory cells. Vth distributions 601, 602 and 603 represent target data states A, B and C, respectively, which are reached by memory cells when their Vth exceeds the verify voltage VvA, VvB or VvC, respectively. VvEr is an erase verify voltage.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

Optional offset verify voltages are also depicted. To obtain narrow Vth distributions while minimizing a programming time penalty, a slow programming mode may be implemented for a memory cell when its Vth exceeds an offset verify voltage which is below the final verify voltage of the target data state to which the memory cell is being programmed. For example, for the A state, VvA_off0 and VvA_off1 are example offset verify voltages and VvA is the final verify voltage. For the B state, VvB_off0 and VvB_off1 are example offset verify voltages and VvB is the final verify voltage. For the C state, VvC_off0 and VvC_off1 are example offset verify voltages and VvC is the final verify voltage. A slow programming mode may be implemented for a memory cell by raising an associated bit line voltage to a positive value, thereby slowing programming of the memory cell. Prior to the slow programming mode, the memory cell may be in a fast programming mode in which Vbl=0 V to maximize the programming speed. Thus, the Vth of a memory cell can increase at a relatively fast rate with each program voltage initially in the programming operation until the Vth moves closer to the final verify voltage. At this time, the Vth of the memory cell increases at a relatively slow rate with each program voltage so that it does not excessively overshoot the final verify voltage. The memory cell is locked out from further programming when its Vth exceeds the final verify voltage, e.g., by setting Vbl to a high level such as 2-3 V during subsequent program voltages of the program operation.

In this example, there are two offset verify voltages for each target data state, as an example. By providing two (or more) offset verify voltages for a target data state, memory cells with different intrinsic programming speeds (but the same target data state) can begin the slow programming mode at different times and/or when a different criterion is met. For example, the A, B or C state memory cells with a relatively fast intrinsic programming speed can begin the slow programming mode when their Vth exceeds VvA_off0, VvB_off0 and VvC_off0, respectively. The A, B or C state memory cells with a relatively slow intrinsic programming speed can begin the slow programming mode when their Vth exceeds VvA_off1, VvB_off1 and VvC_off1, respectively. By adjusting the offset verify voltage which is used to trigger a slow programming mode based on the intrinsic programming speeds of the memory cells, a narrower Vth distribution can be achieved for all of the memory cells.

In another approach, a respective offset verify voltage (e.g., VvA_off0, VvB_off0, VvC_off0) of a target data state (A, B, C, respectively) which is used to trigger a slow programming mode is provided for the second (and/or third) row of memory cells without providing a respective offset verify voltage of the target data state which is used to trigger a slow programming mode for the first row of memory cells. This approach can reduce programming time since the number of sensing operations is reduced compared to the case of providing a respective offset verify voltage for all rows. The row with the slowest programming speed may not require a respective offset verify voltage to achieve a sufficiently narrow Vth distribution.

Figure 6B:
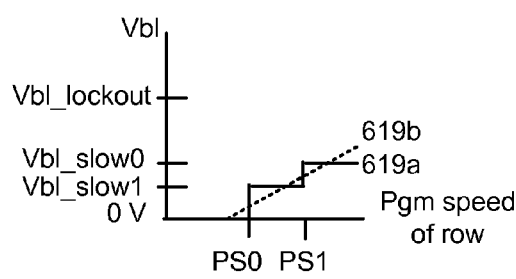
FIG. 6B depicts a plot of a bit line voltage versus an intrinsic programming speed of a row of memory cells, consistent with step 593a of FIG. 5.

FIG. 6B depicts a plot of a bit line voltage versus an intrinsic programming speed of a row of memory cells, consistent with step 593a of FIG. 5. The intrinsic programming speed may be the speed with Vbl=0 V, for instance, e.g., in the fast programming mode. The programming speed may be measured in arbitrary units, such as a number or portion of cells which exceed a specified verify voltage after a specified number of program voltages, a number of program voltages (e.g., program verify-iterations) needed to cause a specified number of cells to exceed a specified verify voltage, a metric indicating a rate of increase of Vth with each program voltage, or some other metric. The bit line voltage can be adjusted to slow down the memory cells which have a higher intrinsic programming speed so that all cells have a substantially similar effective programming speed.

An elevated bit line voltage may be used in different situations. In one possible situation, the offset verify voltages are not used and an elevated Vbl may be applied to the faster programming group of cells while Vbl=0 V is applied to a slower programming group of cells. This slows down the faster programming group of cells to balance the effective programming speed for all cells. In one approach, the elevated Vbl is applied to the faster programming group of cells during each program voltage of a programming operation so that the faster programming group of cells is in a slow programming mode throughout the programming operation.

In another possible situation, an elevated Vbl is used for the faster programming group of cells only after the Vth of the memory cells has passed an offset verify voltage. In this case, the faster programming group of cells are initially in a fast programming mode and subsequently are in a slow programming mode during the programming operation. In another possible situation, an elevated Vbl is also used for the slower programming group of cells only after the Vth of the memory cells has passed an offset verify voltage. In this case, the slower programming group of cells are initially in a fast programming mode and subsequently are in a slow programming mode during the programming operation. For a target data state, the offset verify voltage can be the same for the slower and faster programming groups of cells, while Vbl is higher for the faster programming group of cells. Or, the offset verify voltage can be lower for the faster programming groups of cells, so that the faster programming group of cells is in the slow programming mode for more program-verify iterations compared to the slower programming group of cells.

In this example, if a row of cells has a programming speed below a value PS0, Vbl=0 V during each program voltage, so that a slow programming mode is not used for these cells. If a row of cells has a programming speed from PS0-PS1, Vbl=Vbl_slow1, so that a weak slow programming mode is used for these cells. If a row of cells has a programming speed above PS1, Vbl=Vbl_slow0, so that a strong slow programming mode is used for these cells. Vbl_lockout is a relatively high voltage which inhibits programming of a memory cell. The intrinsic programming speed of a row of memory cells can be determined from testing at the time of manufacture, and/or while the memory device is in the hands of the end user.

For example, in FIG. 4F, the row 503 may have a programming speed above PS1. The corresponding bit line voltage can be set at one level of a number of discrete levels, e.g., Vbl_slow0, according to the stair-shaped solid line 619a. Or, the bit line voltage can be set according to a gradually increasing function, as indicated by the dashed line 619b. The bit line voltage can be set for a group of cells based on a measure (e.g., average or median) of the programming speed of the group.

Another option is to have three or more categories of programming speed with a corresponding number of different bit line voltages in the slow programming mode. For example, in FIG. 4H, the bit line voltages of the rows 543, 544 and 545 can be first, second and third highest, respectively.

In one approach, the program speed-based bit line voltages are provided when the programming operation begins, to balance the program speeds and slope among the memory cells. The bit line voltages can be determined by both the program speeds and slopes. In this approach, variations between cell program speeds and program slopes are suppressed and the natural Vth distribution width will be narrowed. As a result, the final Vth distribution widths for the programmed cell will be narrower. Also, since the program speeds of the memory cells are aligned from the beginning, the starting program voltage could be set higher, to shorten the overall programming time.

Figure 6C:
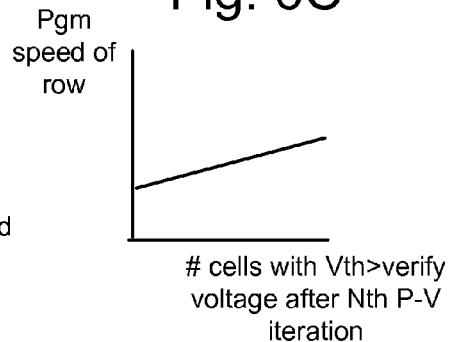
FIG. 6C depicts a plot of a programming speed of a row of memory cells versus a number (#) of cells with a Vth>verify voltage after an Nth program-verify (P-V) iteration, consistent with step 594a of FIG. 5.

FIG. 6C depicts a plot of a programming speed of a row of memory cells versus a number (#) of cells with a Vth>verify voltage after an Nth program-verify (P-V) iteration, consistent with step 594a of FIG. 5. In this option, the programming speed of memory cells is determined during a programming operation. Generally, it is possible to determine the programming speed of a set of memory cells by observing how quickly the Vth increase during an initial portion of the programming operation, e.g., during an initial number of program-verify iterations. For example, a specified verify voltage can be used as a checkpoint. A number of the memory cells which have a Vth higher than the checkpoint can be counted in the verify portion of an Nth program-verify iteration, where N is a positive integer of one or more. When the number is relatively higher, the programming speed is relatively faster. Once a determination is made regarding the programming speed, this information can be used to adjust a remainder of the programming operation, e.g., during a remaining number of program-verify iterations.

In one approach, the programming speed is determined for memory cells which are being programmed to a relatively low target data state, e.g., the A state. For example, a number of A state cells with Vth>VvA can be counted in the third program-verify iteration. See also FIG. 6F. It can be assumed that the programming speed is independent of the target data state because the target data states are assigned randomly to the memory cells.

In another approach, the programming speed is determined for memory cells which are being programmed to each of the target data states. For example, a number A, B and C state cells with Vth>VvA can be counted in the third program-verify iteration. By using the existing verify voltage, VvA, for instance, as the checkpoint verify voltage, this avoids using an additional verify voltage which results in an additional sensing operation and a corresponding time penalty.

The adjustment to the remainder of the programming operation can involve, e.g., the setting of offset verify voltages and/or bit line voltages. For example, see FIG. 6E regarding the offset verify voltages. Regarding the bit line voltages, FIG. 6B indicated how Vbl can be set to a relatively high level, Vbl_slow0, for cell (or a group of cells such as a row) with a relatively high programming speed, and to a relatively low level, Vbl_slow1, for cell (or a group of cells such as a row) with a relatively low programming speed.

Figure 6D:
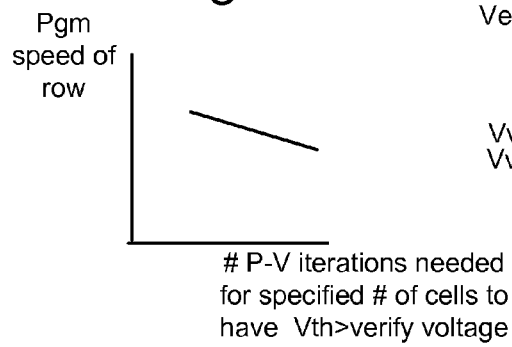
FIG. 6D depicts a plot of a programming speed of a row of memory cells versus a number (#) of P-V iterations needed for a specified number of the memory cells to have Vth>verify voltage, consistent with step 594a of FIG. 5.

FIG. 6D depicts a plot of a programming speed of a row of memory cells versus a number (#) of P-V iterations needed for a specified number of the memory cells to have Vth>verify voltage, consistent with step 594a of FIG. 5. For example, a number of program-verify iterations may be counted which are needed to cause at least 80% of the A state cells to have a Vth>VvA, or at least 80% of the A, B and C state cells to have a Vth>VvA. This number is a positive integer. When the number is relatively higher, the programming speed is relatively slower. While the number obtained in FIG. 6D provides a valid indication of programming speed, the number obtained in in FIG. 6C provides a higher granularity in measuring programming speed.

Figure 6E:
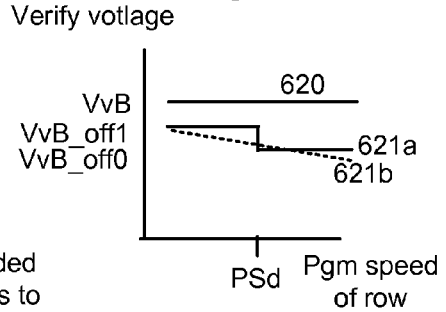
FIG. 6E depicts a plot of verify voltages for an example target data state for a row of memory cells versus a programming speed of the memory cells, consistent with step 594b of FIG. 5.

FIG. 6E depicts a plot of verify voltages for an example target data state (e.g., the B state) for a row of memory cells versus a programming speed of the memory cells, consistent with step 594b of FIG. 5. A plot 620 depicts the final verify voltage for the B state. A plot 621 depicts a relatively high offset verify voltage, VvB_off1 which is used for a row of memory cells which has a relatively slow programming speed (below a demarcation level of PSd) and a relatively low offset verify voltage, VvB_off0 which is used for a row of memory cells which has a relatively high programming speed (above PSd). Other target data state can similarly have different offset verify voltages based on programming speed. Optionally, three or more offset verify voltages could be used for cells of a target data state. For example, in FIG. 4H, the offset verify voltages of a target data state of the rows 545, 544 and 543 can be first, second and third highest, respectively. The use of multiple offset verify voltages can result in a time penalty due to the additional sensing operations.

For example, in FIG. 4F, the row 503 may have a programming speed above PSd while the row 502 has a programming speed below PSd. The corresponding offset verify voltage can be set at one level of a number of discrete levels, e.g., VvB_off1 or VvB_off0, according to the stair-shaped solid line 621a. Or, the offset verify voltage can be set according to a gradually decreasing function, as indicated by the dashed line 621b. The offset verify voltage of a target data state can be set for a group of cells based on a measure (e.g., average or median) of the programming speed of the group. In one approach, for a group of cells, a difference between the final verify voltage and the offset verify voltage is equal for different target data states. In another approach, for the group of cells, the difference is different for different target data states. For example, the difference can be relatively greater for relatively higher target data states.

Another option is to provide a different number of offset verify voltages for different target data states. For example, it may be sufficient to provide one offset verify voltage for the highest target data state, e.g., the C state, while providing two offset verify voltages for the second highest target data state, e.g., the B state, due to a greater tolerance for a Vth overshoot for the C state.

Figure 6F:
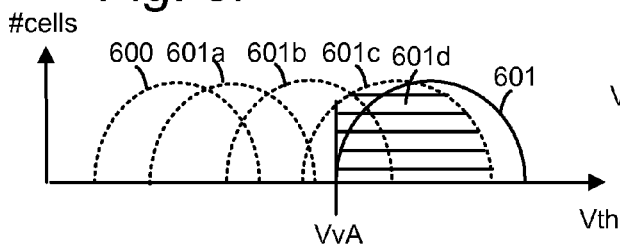
FIG. 6F depicts a Vth distribution of memory cells when measuring a programming speed, consistent with step 594a of FIG. 5 and with FIGS. 6C and 6D.

FIG. 6F depicts a Vth distribution of memory cells when measuring a programming speed, consistent with step 594a of FIG. 5 and with FIGS. 6C and 6D. Here, the example verify voltage which is used to measure the programming speed is VvA. As the memory cells are programmed from the erased state, the Vth distribution 601c is obtained after three program-verify iterations, as an example. Specifically, the Vth distributions 601a, 601b, 601c and 600 are obtained after one, two, three and four program-verify iterations or program voltages, starting from the Vth distribution 600 of the erased stated. A region 601d of the Vth distribution 601c indicates a number of cells which have a Vth>VvA. A count of such cells can be made, as discussed, as a metric of programming speed.

In one example, the programming speed of a row of memory cells at a certain distance from the edge of a region of a word line layer is based on a number of memory cells in the row which reach a specified threshold voltage (e.g., VvA) after a specified number of program-verify iterations of a plurality of program-verify iterations. For example, the number can be measured after three program-verify iterations, consistent with FIG. 6C (N=3). In another example, the number of memory cells in the row which reach the specified threshold voltage can be measured after each program-verify iteration until the number is more than a specified number, e.g., 80% of all cells. In either case, the memory cells which are used to measure the programming speed can be all cells being programmed, or a subset of cells being programmed. For instance, the subset can be cells with one or more specified target data states. In another approach, the subset can be cells associated with every nth bit line, where n is a positive integer of two or more.

The programming speed can be based on when a group of cells reaches a programming milestone. For example, the programming speed of a first row of memory cells at a first distance from a first edge can be based on a number of program-verify iterations of the plurality of program-verify iterations needed for the first row of memory cells to reach a programming milestone, and the programming speed of a second row of memory cells at a second distance from the first edge can be based on a number of program-verify iterations of the plurality of program-verify iterations needed for the second row of memory cells to reach the same, or another, programming milestone. For instance, the programming milestone can be met by the first row of memory cells when at least a specified number of memory cells in the first row of memory cells reach a specified threshold voltage (e.g., VvA). The programming milestone can be met by the second row of memory cells when at least a specified number of memory cells in the second row of memory cells reach a specified threshold voltage. This specified threshold voltage can be the same or different for different rows or other groups.

Figure 6G:
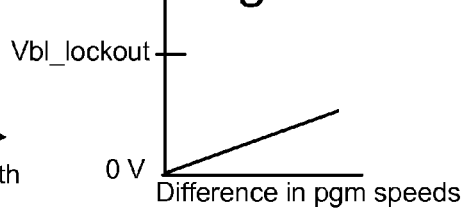
FIG. 6G depicts a plot of a bit line voltage versus a difference in intrinsic programming speeds of different rows of memory cells, consistent with step 593a of FIG. 5.

FIG. 6G depicts a plot of a bit line voltage versus a difference in intrinsic programming speeds of different rows of memory cells, consistent with step 593a of FIG. 5. This approach sets the bit line voltage for a faster programming row of memory cells (e.g., row 503 in FIG. 4F) in proportion to an amount by which its programming speed exceeds the programming speed of a slower programming row of memory cells (e.g., row 502 in FIG. 4F). Referring to FIG. 6F, after three program-verify iterations, for example, it may be determined that 70% of the memory cells being programmed in row 502 have a Vth>VvA and 80% of the memory cells being programmed in row 508 have a Vth>VvA. Accordingly, the difference in programming speed is represented by the metric of 10% of the memory cells. A bit line voltage and/or offset verify voltage can be modified for the faster programming row of memory cells based on the difference in a remainder of the programming. This approach advantageously provides a compensation during programming based on the relative speeds of the rows of cells so that an optimum equalization in effective programming speed can be achieved.

In another approach, a separate test process can be performed to determine the relative programming speeds, prior to the programming operation. For example, the test process can involve applying a fixed number of program voltages to the memory cells and measuring the programming speed by counting the number of cells which exceed a specified Vth, for each group of cells. In response to the test, the controller can store data for use in the normal programming operation in which user data is stored in the set of memory cells.

FIG. 7A depicts a set of program voltages, consistent with step 593 of FIG. 5. The vertical axis depicts Vcg, a control gate or word line voltage, and the horizontal axis depicts time or program loop number (e.g., program-verify iteration number). A one pass programming operation with four data states is depicted in FIG. 7A-7E. Other options are possible. The programming operation comprises a series of waveforms 700 comprising program voltages 701-709. Incremental step pulse programming is performed, such that Vpgm begins at an initial level, Vpgm_init and increases step-wise in each program loop. This example also performs verify tests based on the program loop (see FIG. 7C-7E). For example, the A state cells are verified in loops 1 and 2, the A and B state cells are verified in loops 3-5, the B and C state cells are verified in loops 6-8 and the C state cells are verified in loop 9. The horizontal axes of FIG. 7A-7E are time-aligned.

FIG. 7B depicts a set of bit line voltages, consistent with steps 593 and 593a of FIG. 5 and with FIG. 6B. Each short horizontal line represents a bit line voltage which can be applied during a corresponding program voltage for a given cell. For example, Vbl_inhibit may be applied to the bit lines for the memory cells with a lockout status (e.g., the erased state cells or the memory cells which have completed programming to a target data state). Vbl_slow0 may be applied to the memory cells with a relatively high intrinsic programming speed, either during all program voltages or during program voltages which occur after these cells reach an offset verify voltage. For instance, this may be the rows of cells which are furthest from the edges of a region of a word line layer and to the adjacent metal interconnects.

Vbl_slow0 may be applied to the memory cells with a relatively low intrinsic programming speed, e.g., during program voltages which occur after these cells reach an offset verify voltage. For instance, this may be the rows of cells which are closest to the edges of a region of a word line layer and to the adjacent metal interconnects. Vbl=0 V may be set for these cells during program voltages which occur before these cells reach an offset verify voltage.

FIG. 7C depicts a set of verify voltages, consistent with step 594 of FIG. 5. Waveforms 711 and 712 in program loops 1 and 2, respectively, have a magnitude of VvA. Waveforms 713, 714 and 715 in program loops 3, 4 and 5, respectively, have a magnitude of VvA and VvB. Waveforms 716, 717 and 718 in program loops 6, 7 and 8, respectively, have a magnitude of VvB and VvC. Waveform 719 in program loop 9 has a magnitude of VvC. In this example, an offset verify voltage is not used. Instead, the final verify voltages of the target data states are used without offset verify voltages. The use of different bit line voltages such as depicted in FIG. 7B can be used to equalize the effective programming speeds of the different rows or other groups of memory cells.

Specifically, in program loops 1 and 2, sensing occurs for the A state cells at VvA. In program loops 3, 4 and 5, sensing occurs for the A state cells at VvA and for the B state cells at VvB. In program loops 6, 7 and 8, sensing occurs for the B state cells at VvB and for the C state cells at VvC. In program loop 9, sensing occurs for the C state cells at VvC.

FIG. 7D depicts a set of verify voltages, consistent with steps 594 and 594b of FIG. 5 and with FIG. 6A, where two offset verify voltages and a final verify voltage are used for each target data state. Waveforms 721 and 722 in program loops 1 and 2, respectively, have a magnitude of VvA_off0, VvA_off1 and VvA. Waveforms 723, 724 and 725 in program loops 3, 4 and 5, respectively, have a magnitude of VvA_off0, VvA_off1, VvA, VvB_off0, VvB_off1 and VvB. Waveforms 726, 727 and 728 in program loops 6, 7 and 8, respectively, have a magnitude of VvB_off0, VvB_off1, VvB VvC_off0, VvC_off1 and VvC. Waveform 729 in program loop 9 has a magnitude of VvC_off0, VvC_off1 and VvC.

Specifically, in program loops 1 and 2, sensing occurs for the A state cells in the rows with the higher intrinsic programming speed at VvA_off0 and VvA and for the A state cells in the rows with the lower intrinsic programming speed at VvA_off1 and VvA. In program loops 3, 4 and 5, sensing occurs for the A state cells in the rows with the higher intrinsic programming speed at VvA_off0 and VvA, for the A state cells in the rows with the lower intrinsic programming speed at VvA_off1 and VvA, for the B state cells in the rows with the higher intrinsic programming speed at VvB_off0 and VvB, and for the B state cells in the rows with the lower intrinsic programming speed at VvB_off1 and VvB. In program loops 6, 7 and 8, sensing occurs for the B state cells in the rows with the higher intrinsic programming speed at VvB_off0 and VvB, for the B state cells in the rows with the lower intrinsic programming speed at VvB_off1 and VvB, for the C state cells in the rows with the higher intrinsic programming speed at VvC_off0 and VvC, and for the C state cells in the rows with the lower intrinsic programming speed at VvC_off1 and VvC. In program loop 9, sensing occurs for the C state cells in the rows with the higher intrinsic programming speed at VvC_off0 and VvC, and for the C state cells in the rows with the lower intrinsic programming speed at VvC_off1 and VvC.

The controller can be configured to know which memory cells are in a group of faster programming or slower programming cells. For example, further to the discussion of FIGS. 4B and 4F, the controller can be configured to know that a first group of bit lines, BL0, BL4, BL8, BL12, BL16 and BL20, is connected to cells in row 505 (a group of slower programming cells), a second group of bit lines, BL2, BL6, BL10, BL14, BL18 and BL22, is connected to cells in row 504 (a group of faster programming cells), a third group of bit lines, BL3, BL7, BL11, BL15, BL19 and BL23, is connected to cells in row 502 (a group of slower programming cells), and a fourth group of bit lines, BL1, BL5, BL9, BL13, BL17 and BL21, is connected to cells in row 503 (a group of faster programming cells). Moreover, each bit line can be connected to respective sensing circuitry (e.g., sense module in FIG. 3). Further, the latches (FIG. 3) store data which identifies a target data state of a memory cell which is to be programmed. The latches indicate a lockout status for memory cells which are to remain in the erased state or which have completed programming to a target data state.

The latches can also indicate when a memory cell has a Vth between the offset verify voltage and the final verify voltage, so that a slow programming mode for the memory cell can be triggered.

The sensing results from sensing circuitry which is connected to a particular set of these bit lines is therefore associated with a particular row or other group of memory cells with a known relative programming speed. During sensing operations at a given verify voltage, the sensing results which are relevant are used by the controller. For example, when sensing at VvB_off0, the sensing results are used for the faster programming memory cells which are associated with any of BL1, BL5, BL9, BL13, BL17 and BL21, and BL2, BL6, BL10, BL14, BL18 and BL22, and which are to be programmed to the B state and have not yet reached VvB_off0, according to the latches. When sensing at VvB_off1, the sensing results are used for the slower programming memory cells which are associated with any of BL0, BL4, BL8, BL12, BL16 and BL20, and BL3, BL7, BL11, BL15, BL19 and BL23, and which are to be programmed to the B state and have not yet reached VvB_off1, according to the latches. When sensing at VvB, the sensing results are used for any of the memory cells which are to be programmed to the B state and have not yet reached VvB, according to the latches. A similar process can apply to other target data states.

FIG. 7E depicts a set of verify voltages, consistent with steps 594 and 594b of FIG. 5 and with FIG. 6A, where one offset verify voltage and a final verify voltage are used for each target data state. Waveforms 731 and 732 in program loops 1 and 2, respectively, have a magnitude of VvA_off0 and VvA. Waveforms 733, 734 and 735 in program loops 3, 4 and 5, respectively, have a magnitude of VvA_off0, VvA, VvB_off0 and VvB. Waveforms 736, 737 and 738 in program loops 6, 7 and 8, respectively, have a magnitude of VvB_off0, VvB, VvC_off0 and VvC. Waveform 739 in program loop 9 has a magnitude of VvC_off0 and VvC.

Specifically, in program loops 1-5, sensing occurs for all of the A state cells, regardless of intrinsic programming speed, at VvA_off0 and VvA. In program loops 3, 4 and 5, sensing also occurs for the B state cells at VvB_off0 and VvB. In program loops 6, 7 and 8, sensing occurs for the B state cells at VvB_off0 and VvB, and for the C state cells at VvC_off0 and VvC. In program loop 9, sensing occurs for the C state cells at VvC_off0 and VvC.

Accordingly, it can be seen that programming techniques for a three-dimensional stacked memory device provide compensation for different intrinsic programming speeds of different groups of memory cells based on the groups' locations relative to the edge of a word line layer. A larger distance from the edge is associated with a faster programming speed. In one approach, the programming speeds are equalized by elevating a bit line voltage for the faster programming memory cells. Offset verify voltages which trigger a slow programming mode by elevating the bit line voltage can also be set based on the group locations. A programming speed can be measured during programming for a row or other group of cells to set the bit line voltage and/or the offset verify voltages. The compensation for the faster programming memory cells can also be based on their speed relative to the slower programming memory cells.

In one embodiment, a method for programming in a 3D stacked memory device comprises: performing a programming operation for a set of memory cells, the set of memory cells is connected to a selected word line layer among a plurality of word line layers which are vertically spaced apart from one another by dielectric layers in a stack, wherein each memory cell in the set of memory cells is associated with a respective bit line among a plurality of bit lines, the selected word line layer comprises a first edge, the set of memory cells comprises a first row of memory cells at a first distance from the first edge, and a second row of memory cells at a second distance from the first edge, wherein the second distance is greater than the first distance. The performing the programming operation comprises: performing a plurality of program-verify iterations for the selected word line layer, each program-verify iteration of the plurality of program-verify iterations comprises a program portion followed by a verify portion, wherein at least one program-verify iteration of the plurality of program-verify iterations provides compensation for different programming speeds of the first row of memory cells and the second row of memory cells.

In another embodiment, a 3D stacked memory device comprises: a plurality of word line layers which are vertically spaced apart from one another by dielectric layers in a stack, the plurality of word line layers comprise a selected word line layer which is selected for programming, the selected word line layer extends between a first edge and a second edge and comprises a set of memory cells, the set of memory cells comprises a first row of memory cells which is adjacent to the first edge and a second row of memory cells which is adjacent to the first row, each memory cell in the set of memory cells is associated with a respective bit line among a plurality of bit lines. The device further comprises a control circuit, where the control circuit, to perform a programming operation for the set of memory cells, is configured to: concurrently apply a program voltage to the selected word line layer and apply voltages to the plurality of bit lines, wherein the voltages applied to the plurality of bit lines comprise a first voltage which is applied to respective bit lines associated with the first row of memory cells and a second voltage which is applied to respective bit lines associated with the second row of memory cells, and the second voltage is greater than the first voltage and is a positive voltage.

In another embodiment, a memory controller for a 3D stacked memory device comprises: a storage device comprising a set of instructions and a processor operable to execute the set of instructions. The set of instructions comprises: instructions to perform a programming operation for a set of memory cells, the set of memory cells is connected to a selected word line layer among a plurality of word line layers which are vertically spaced apart from one another by dielectric layers in a stack, and each memory cell in the set of memory cells is associated with a respective bit line among a plurality of bit lines. The instructions to perform the programming operation comprise instructions to apply a program voltage to the selected word line layer while applying a voltage to each respective bit line based on a location of the associated memory cell within the selected word line layer.

In another embodiment, a 3D stacked memory device comprises: a plurality of word line layers which are vertically spaced apart from one another by dielectric layers in a stack, the plurality of word line layers comprise a selected word line layer which is selected for programming, the selected word line layer extends between a first edge and a second edge and comprises a set of memory cells, the set of memory cells comprises a row of memory cells at a first distance from the first edge and a row of memory cells at a second distance from the first edge, and each memory cell of the set of memory cells is associated with a respective bit line of a plurality of bit lines. The device further comprises a control circuit, where the control circuit, to perform a programming operation for the set of memory cells, is configured to: perform a plurality of program-verify iterations for the selected word line layer, each program-verify iteration of the plurality of program-verify iterations comprises a program portion followed by a verify portion, wherein for at least one program-verify iteration of the plurality of program-verify iterations, a value of a parameter for the row of memory cells at the first distance from the first edge is different than a value of the parameter for the row of memory cells at the second distance from the first edge.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a 3D stacked memory device, comprising:
   performing a programming operation for a set of memory cells, the set of memory cells is connected to a selected word line layer among a plurality of word line layers which are vertically spaced apart from one another by dielectric layers in a stack, wherein each memory cell in the set of memory cells is associated with a respective bit line among a plurality of bit lines, the selected word line layer comprises a first edge, the set of memory cells comprises a first row of memory cells at a first distance from the first edge, and a second row of memory cells at a second distance from the first edge, wherein the second distance is greater than the first distance, and the performing the programming operation comprises:
      performing a plurality of program-verify iterations for the selected word line layer, each program-verify iteration of the plurality of program-verify iterations comprises a program portion followed by a verify portion, wherein at least one program-verify iteration of the plurality of program-verify iterations provides a compensation for different programming speeds of the first row of memory cells and the second row of memory cells.

2. The method of claim 1, wherein:
the compensation is provided during the program portion by providing a bit line voltage for the second row of memory cells which is higher than a bit line voltage of the first row of memory cells.

3. The method of claim 2, further comprising:
measuring a first programming speed of the first row of memory cells; and
measuring a second programming speed of the second row of memory cells, wherein the bit line voltage for the first row of memory cells is based on the first programming speed and the bit line voltage for the second row of memory cells is based on the second programming speed.

4. The method of claim 2, further comprising:
measuring a first programming speed of the first row of memory cells; and
measuring a second programming speed of the second row of memory cells; and
determining a difference between the first and second programming speeds, wherein the bit line voltage for the second row of memory cells is proportional to the difference.

5. The method of claim 2, wherein:
the bit line voltage for the first row of memory cells is 0 V.

6. The method of claim 1, wherein:
the compensation is provided during the program portion by providing a first respective offset verify voltage of a target data state which is used to trigger a slow programming mode for the first row of memory cells and providing a second respective offset verify voltage of the target data state which is used to trigger a slow programming mode for the second row of memory cells, wherein the first respective offset verify voltage is greater than the second respective offset verify voltage.

7. The method of claim 1, wherein:
the compensation is provided during the program portion by providing a respective offset verify voltage of a target data state which is used to trigger a slow programming mode for the second row of memory cells without providing a respective offset verify voltage of the target data state which is used to trigger a slow programming mode for the first row of memory cells.

8. The method of claim 1, wherein:
the compensation is provided in response to measuring of a programming speed of the second row of memory cells during the programming operation, prior to the at least one program-verify iteration of the plurality of program-verify iterations.

9. The method of claim 8, wherein:
the programming speed of the second row of memory cells is based on a number of memory cells in the second row of memory cells which reach a specified threshold voltage after a specified number of program-verify iterations of the plurality of program-verify iterations.

10. The method of claim 8, wherein:
the programming speed of the second row of memory cells is based on a number of program-verify iterations of the plurality of program-verify iterations needed for at least a specified number of memory cells in the second row of memory cells to reach a specified threshold voltage.

11. The method of claim 1, wherein:
the set of memory cells comprises a third row of memory cells at a third distance from the first edge;
the third distance is greater than the second distance; and
the at least one program-verify iteration of the plurality of program-verify iterations provides the compensation for different programming speeds of the first, second and third rows of memory cells.

12. The method of claim 1, wherein:
the first edge is adjacent to a metal interconnect which provides a conductive path from a bottom of the stack to a top of the stack.

* * * * *